United States Patent
Rexberg

(10) Patent No.: US 7,746,955 B2
(45) Date of Patent: Jun. 29, 2010

(54) POWER AMPLIFIER PRE-DISTORTION

(75) Inventor: Leonard Rexberg, Hässelby (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 888 days.

(21) Appl. No.: 10/549,569

(22) PCT Filed: Mar. 5, 2004

(86) PCT No.: PCT/SE2004/000321

§ 371 (c)(1),
(2), (4) Date: Sep. 19, 2005

(87) PCT Pub. No.: WO2004/086607

PCT Pub. Date: Oct. 7, 2004

(65) Prior Publication Data

US 2006/0133536 A1     Jun. 22, 2006

(30) Foreign Application Priority Data

Mar. 25, 2003  (SE) .................................. 0300829

(51) Int. Cl.
*H04K 1/02* (2006.01)
*H04L 25/03* (2006.01)
(52) U.S. Cl. .................. 375/296; 375/285; 375/254
(58) Field of Classification Search ................ 375/296, 375/297, 284, 295; 330/149
See application file for complete search history.

(56) References Cited

U.S. PATENT DOCUMENTS

| | | | |
|---|---|---|---|
| 4,816,914 A * | 3/1989 | Ericsson ................ | 375/240.03 |
| 5,832,022 A | 11/1998 | Scott | |
| 5,867,065 A | 2/1999 | Leyendecker | |
| 5,923,712 A * | 7/1999 | Leyendecker et al. ....... | 375/297 |
| 6,141,390 A | 10/2000 | Cova | |
| 6,356,146 B1 | 3/2002 | Wright et al. | |
| 6,404,823 B1 | 6/2002 | Grange et al. | |
| 6,614,854 B1 * | 9/2003 | Chow et al. ................. | 375/297 |
| 7,397,850 B2 * | 7/2008 | Easley et al. ................ | 375/240 |
| 2002/0008578 A1 | 1/2002 | Wright et al. | |
| 2002/0044014 A1 * | 4/2002 | Wright et al. .................. | 330/2 |
| 2003/0223508 A1 * | 12/2003 | Ding et al. .................. | 375/296 |

FOREIGN PATENT DOCUMENTS

EP          0 813 300      12/1997

(Continued)

OTHER PUBLICATIONS

Search report in corresponding Great Britain Application No. GB 0114803.0 mailed Aug. 2, 2002.

(Continued)

*Primary Examiner*—Chieh M Fan
*Assistant Examiner*—Qutbuddin Ghulamali
(74) *Attorney, Agent, or Firm*—Nixon & Vanderhye P.C.

(57) ABSTRACT

A power amplifier pre-distorter is formed by a FIR filter structure that includes an individual look-up table for each filter tap, where each look-up table represents a sampled polynomial in a variable representing signal amplitude. An absolute value block selects, from each filter tap look-up table, a filter coefficient that depends on the amplitude of a corresponding complex signal value to be multiplied by the filter tap. This structure can pre-distort both for amplitude distortion and memory effects in the power amplifier.

18 Claims, 9 Drawing Sheets

FOREIGN PATENT DOCUMENTS

| | | |
|---|---|---|
| EP | 1 011 192 | 6/2000 |
| GB | 2 376 613 | 12/2002 |
| WO | WO 99/57806 | 11/1999 |

OTHER PUBLICATIONS

Kim et al., Digital predistortion of wideband signals based on power amplifier model with memory, Electronics Letters, Nov. 8, 2001, vol. 37, No. 23, pp. 1417-1418.

Lei Ding et al., A Robust Digital Baseband Predistorter Constructed Using Memory Polynomials. Manuscript submitted to IEEE Trans. on Communication, Mar. 16, 2002, pp. 1-23.

U.S. Appl. No. 10/560,346, filed Dec. 12, 2005; Inventor: Rexberg.

Office Action mailed Aug. 20, 2008 in co-pending U.S. Appl. No. 10/560,346.

International Search Report of PCT/SE2003/001032, mailed Feb. 10, 2004.

Lei Ding et al., "A Robust Digital Baseband Predistorter Constructed Using Memory Polynomials", IEEE Trans. on Communication, Mar. 16, 2002, pp. 1-23.

J. Kim et al., "Digital predistortion of wideband signals based on power amplifier model with memory", Electronics Letters, Nov. 8, 2001, vol. 37, No. 23, pp. 1417-1418.

James K. Cavers, "Amplifier Linearization Using a Digital Predistorter with Fast Adaptation and Low Memory Requirements", IEEE Transactions on Vehicular Technology, Nov. 1990, vol. 39, No. 4, pp. 374-382.

Office Action mailed Feb. 6, 2009 in co-pending U.S. Appl. No. 10/560,346.

Office Action mailed Aug. 4, 2009 in co-pending U.S. Appl. No. 10/560,346.

European official action, Dec. 8, 2009, in corresponding European Application No. 04 717 919.7 - 2210.

\* cited by examiner

US 7,746,955 B2

POWER AMPLIFIER PRE-DISTORTION

This application is the US national phase of international application PCT/SE2004/000321, filed 5 Mar. 2004, which designated the U.S. and claims priority of SE 0300829-9, filed 25 Mar. 2003, the entire contents of each of which are hereby incorporated by reference.

TECHNICAL FIELD

The technology described here relates to implementing digital pre-distortion in power amplifiers where memory effects occur and where parameters depend on, for example, the average signal power level or device temperature.

BACKGROUND

Power amplifiers are known to distort the signal they are designed to amplify. The reason for this is that a power amplifier has a non-linear input-output signal characteristic. This shows up as a broadened spectrum around the desired amplified signal, and as an unwanted inband component of the signal. As a counter-measure to decrease the effects of non-linearity, it is known to pre-distort the signal at the input of the amplifier as to give an un-distorted amplified signal at the output of the amplifier. This technique is called pre-distortion. Pre-distortion as implemented today normally uses a look-up table that is used to multiply the signal. The entry into the table is the magnitude of the signal at every time sample.

A variation of the single look-up table approach for handling non-linearity is described in [1]. Here a FIR filter is used to handle both non-linearity and inter-symbol interference. Instead of performing the filter coefficient multiplication at each filter tap explicitly, look-up tables are used to perform this task.

Memory effects is another problem related to power amplifiers. Memory effects typically show up as a non-symmetrical spectrum around the carrier at the output of a power amplifier. That is, although the carrier (desired signal) spectrum is perfectly symmetrical, the spurious spectrum coming from the distortion may be non-symmetrical with respect to the center of the carrier.

The methods used to handle non-linearity do not take into account memory effects of the power amplifier. As the term "memory effects" indicates, there is a dependence not only on the present sample but also on previous samples of the signal. Thus, the previously used single table approach cannot take care of memory effects, but can only handle non-linearity.

Reference [2] suggests handling memory effects by using an envelope filter, which considers both the current and previous sample amplitudes in calculating a weighted multiplication coefficient that is intended to account for memory effects.

Lei Ding et. al. [3] inspired by work done by Kim and Konstantinou [4] have derived a pre-distortion method based on what they call "Memory Polynomials" that very well model memory effects. However, this method has the drawback that it requires recalculation of the memory polynomials for each new input signal amplitude, which can be computationally costly, especially if many polynomials of high order are used.

SUMMARY

An object is to provide a computationally efficient pre-distortion method based on memory polynomials.

Briefly, the technology described here is based on the insight that the memory polynomial approach can be implemented as a FIR type structure, in which the "filter taps" are replaced by look-up tables (representing sampled polynomials) triggered by the input signal amplitude. Preferably further look-up tables are used to track changes in the characteristics of the power amplifier due to, for example, heating of semi-conductor components.

DETAILED DESCRIPTION

In the following description the same reference designations will be used for the same or similar elements throughout the figures of the drawings.

A brief description of the underlying problem will now be given with reference to FIGS. 1-5.

Figure 1:
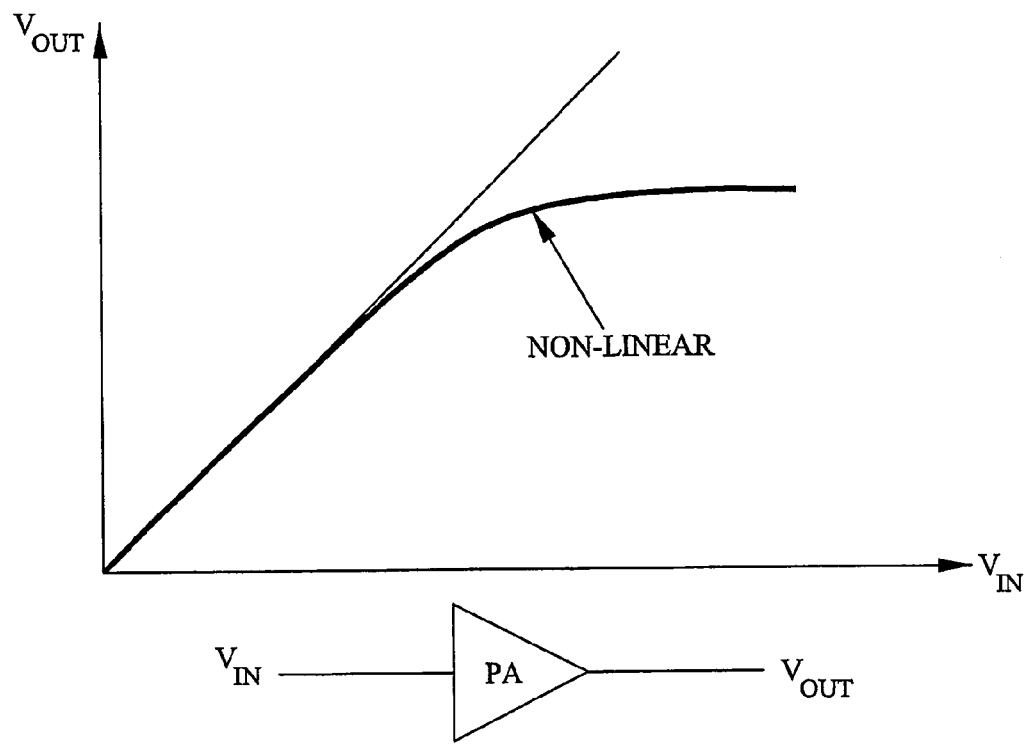
FIG. 1 is a diagram illustrating the non-linear input-output signal characteristic of a power amplifier.
Figure 2:
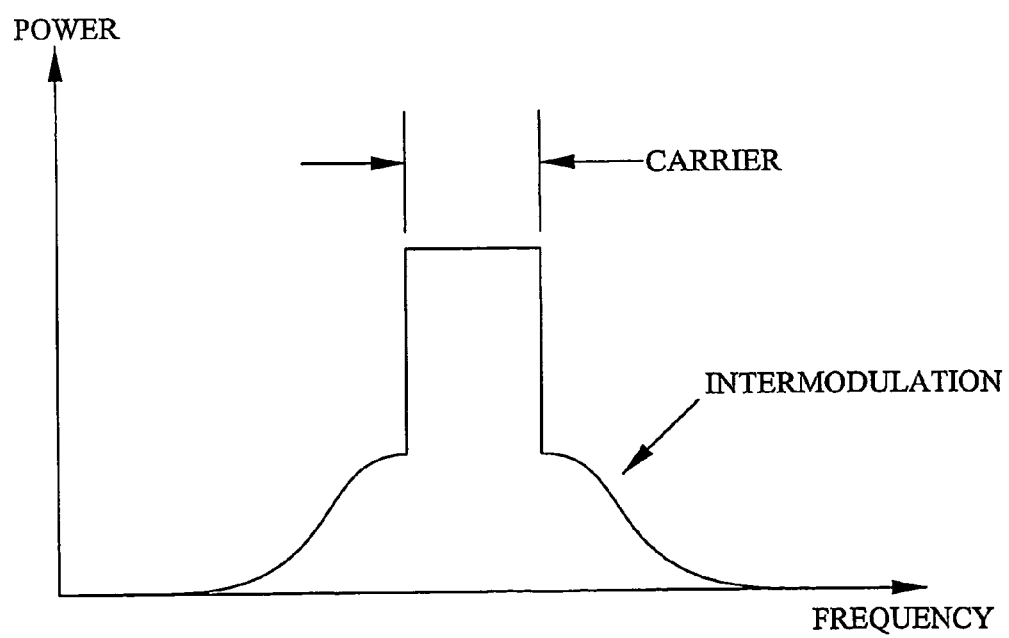
FIG. 2 is a diagram illustrating the spectrum of the signal amplified by a non-linear power amplifier.
Figure 3:
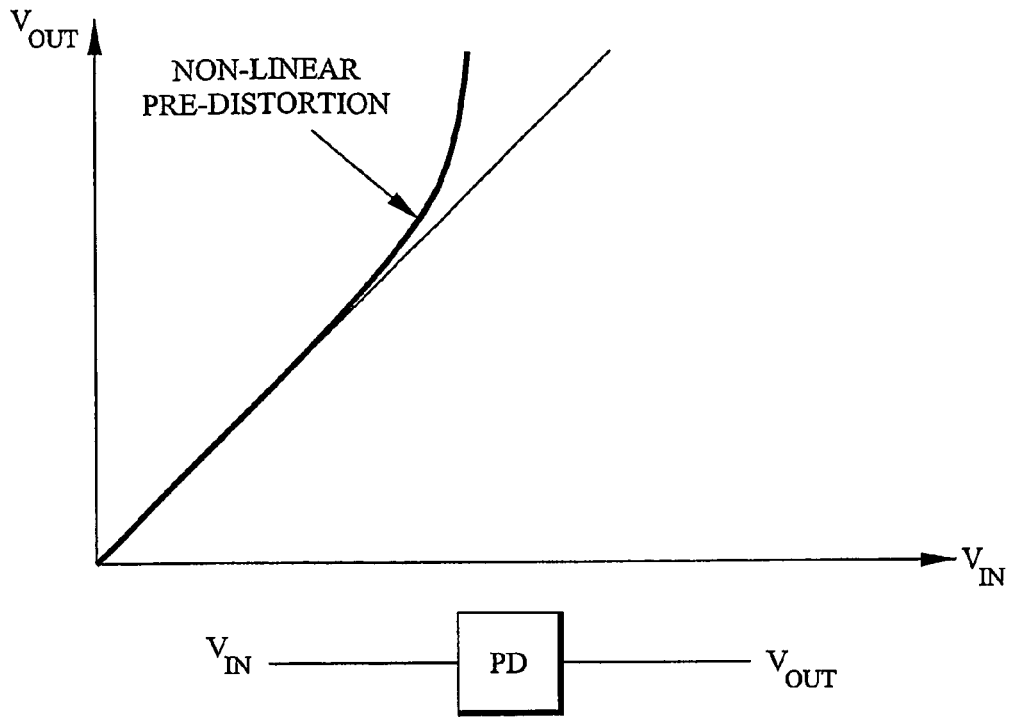
FIG. 3 is a diagram illustrating the input-output signal characteristic of a power amplifier pre-distorter for removing the non-linearity in FIG. 1.
Figure 4:
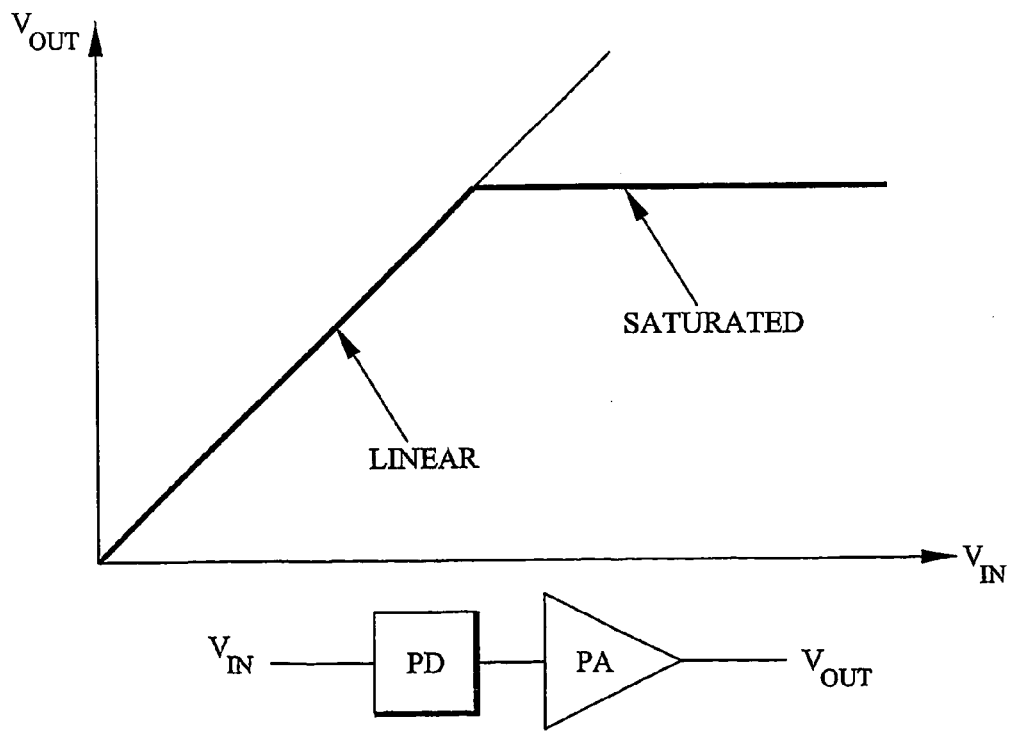
FIG. 4 is a diagram illustrating the input-output signal characteristic of a power amplifier provided with pre-distortion.

FIG. 1 illustrates the non-linear input-output signal characteristic of a power amplifier. At low input signal amplitudes the amplifier is almost linear, but at higher amplitudes it becomes more and more non-linear until it is saturated. This non-linearity shows up as a broadened spectrum around the desired amplified signal (and as an unwanted inband component of the signal), as illustrated in FIG. 2. As a counter-measure to decrease the effects of non-linearity, it is known to pre-distort the signal at the input of the amplifier to give an un-distorted amplified signal at the output of the amplifier. This technique is called pre-distortion and is illustrated in FIG. 3. The input-output signal characteristic for a pre-distorted power amplifier is essentially linear up to saturation, as illustrated in FIG. 4.

Figure 5:
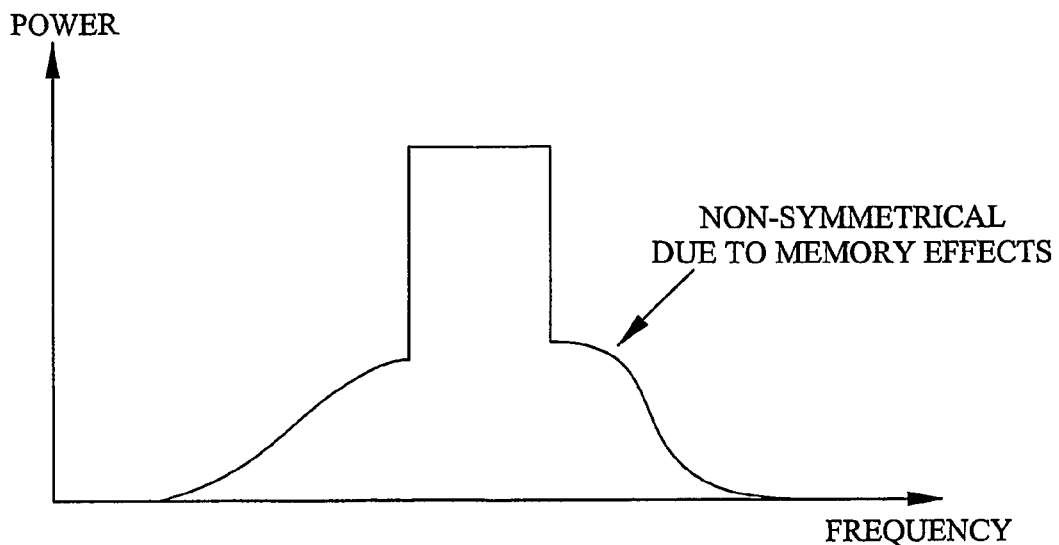
FIG. 5 is a diagram illustrating the spectrum of the signal amplified by a non-linear power amplifier with memory.

Memory effects is another problem related to power amplifiers. Memory effects typically show up as a non-symmetrical spectrum around the carrier at the output of a power amplifier, as illustrated in FIG. 5. That is, although the carrier (desired signal) spectrum is perfectly symmetrical, the spurious spectrum coming from the distortion may be non-symmetrical with respect to the center of the carrier.

There is a theoretical way of designing a pre-distorter that takes care of all memory effects. This is called the Volterra series. The Volterra series is an extension to the well-known Taylor series, which can be used as a pre-distorter for memory-less amplifiers. The Volterra series, however, also takes into account time-delayed terms that may quite accurately model the pre-distortion, and may therefore be used to suppress the distortion spectrum. However, a Volterra series quite rapidly gets large in terms of the number of possible terms in the expansion. For example, a polynomial of degree 5 with a memory depth (maximum delay) of 5 sample units will give rise to at least 500 coefficients.

Since the full Volterra series can not be implemented with reasonable complexity, an approximation based on "Memory Polynomials" has been suggested in [3]. In this approximation the pre-distortion PD(n) may be expressed as:

$$PD(n) = \sum_{k=1}^{K} \sum_{q=0}^{Q} a_{kq} x(n-q)|x(n-q)|^{k-1} \quad (1)$$

where x(n−q) denotes the delayed (by q time units) samples and $a_{kq}$ denotes the expansion coefficients. Unfortunately this expression is still quite complicated, and a drawback of this prior art method is that the expression has to be evaluated for each new input sample x(n). However, as will be shown below, this expression may be rewritten into a more suitable form for practical implementation. The derivation essentially includes three steps:

1. Separate the double sum into partial sums including only terms with the same delay. This gives:

$$PD(n) = \sum_{k=1}^{K} \sum_{q=0}^{Q} a_{kq} x(n-q)|x(n-q)|^{k-1} =$$

Separate delays into different sums
$$\begin{cases} = \sum_{k=1}^{K} a_{k0} x(n)|x(n)|^{k-1} + \\ + \sum_{k=1}^{K} a_{k1} x(n-1)|x(n-1)|^{k-1} + \\ \vdots \\ + \sum_{k=1}^{K} a_{kQ} x(n-Q)|x(n-Q)|^{k-1} \end{cases}$$

2. Here it is noted that the delayed signals x(n−q) do not depend on the summation indices k. Thus the partial sums may be factorized into:

Factorize k and q dependence in each sum
$$\begin{cases} = x(n) \underbrace{\sum_{k=1}^{K} a_{k0} |x(n)|^{k-1}}_{T_0(|x(n)|)} + \\ + x(n-1) \underbrace{\sum_{k=1}^{K} a_{k1} |x(n-1)|^{k-1}}_{T_1(|x(n-1)|)} + \\ \vdots \\ + x(n-Q) \underbrace{\sum_{k=1}^{K} a_{kQ} |x(n-Q)|^{k-1}}_{T_Q(|x(n-Q)|)} \end{cases}$$

3. Identify the polynomials $T_q(|x(n-q)|)$ to obtain:

$$PD(n) = \sum_{q=0}^{Q} x(n-q) T_q(|x(n-q)|) \quad (2)$$

The coefficients $a_{kq}$ may be obtained as a least squares solution to an over-determined system of equations as described in [3].

Figure 6:
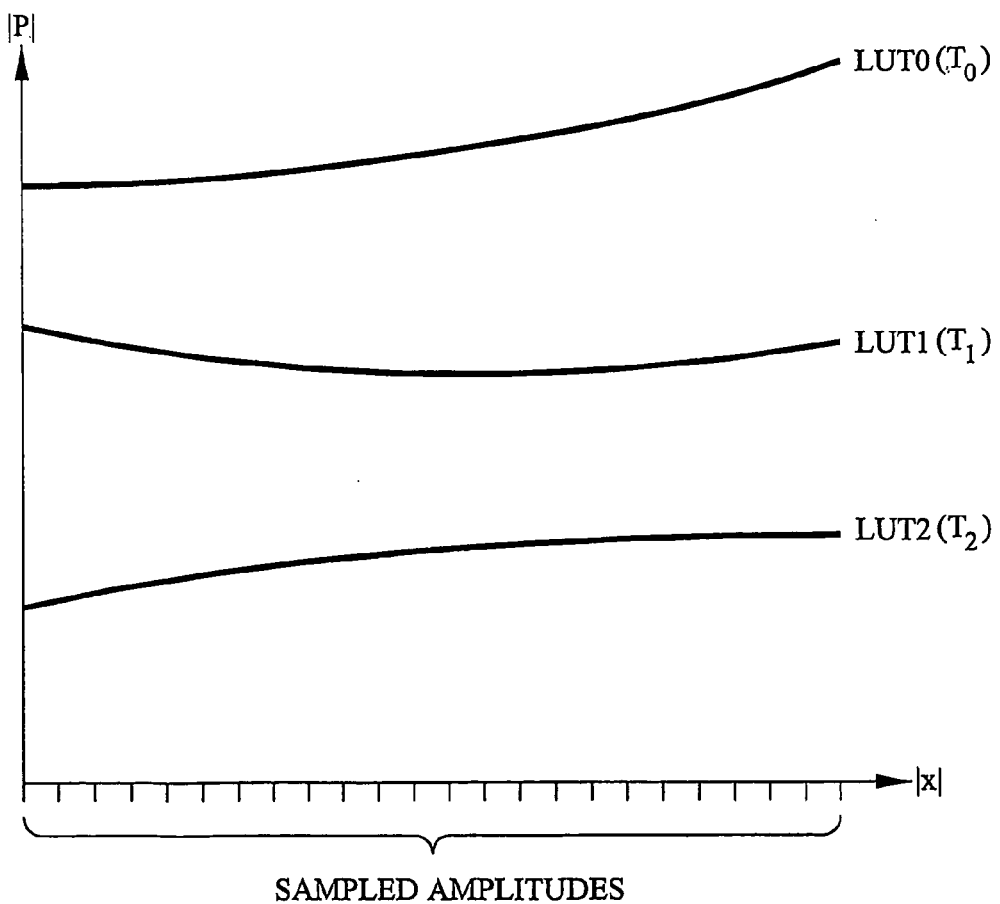
FIG. 6 is a diagram illustrating sampling of polynomials.

It is noted in (2) that $T_q(|x(n-q)|)$ are polynomials in the absolute value of the (complex) variable x(n−q). Thus, by multiplying each delayed complex sample x(n−q) by a polynomial in |x(n−q)| (which has the same delay q) and summing up the products for all delays q, the same end result P(n) as in [3] will be obtained. However, this new approach has the advantage that the polynomials $T_q$ may be sampled at appropriate values of |x(n−q)|, as illustrated in FIG. 6, and stored in look-up tables. This will reduce the pre-distorter to a simple FIR filter structure, in which the normally constant filter coefficients are replaced by these look-up tables, as illustrated in FIG. 7.

Figure 7:
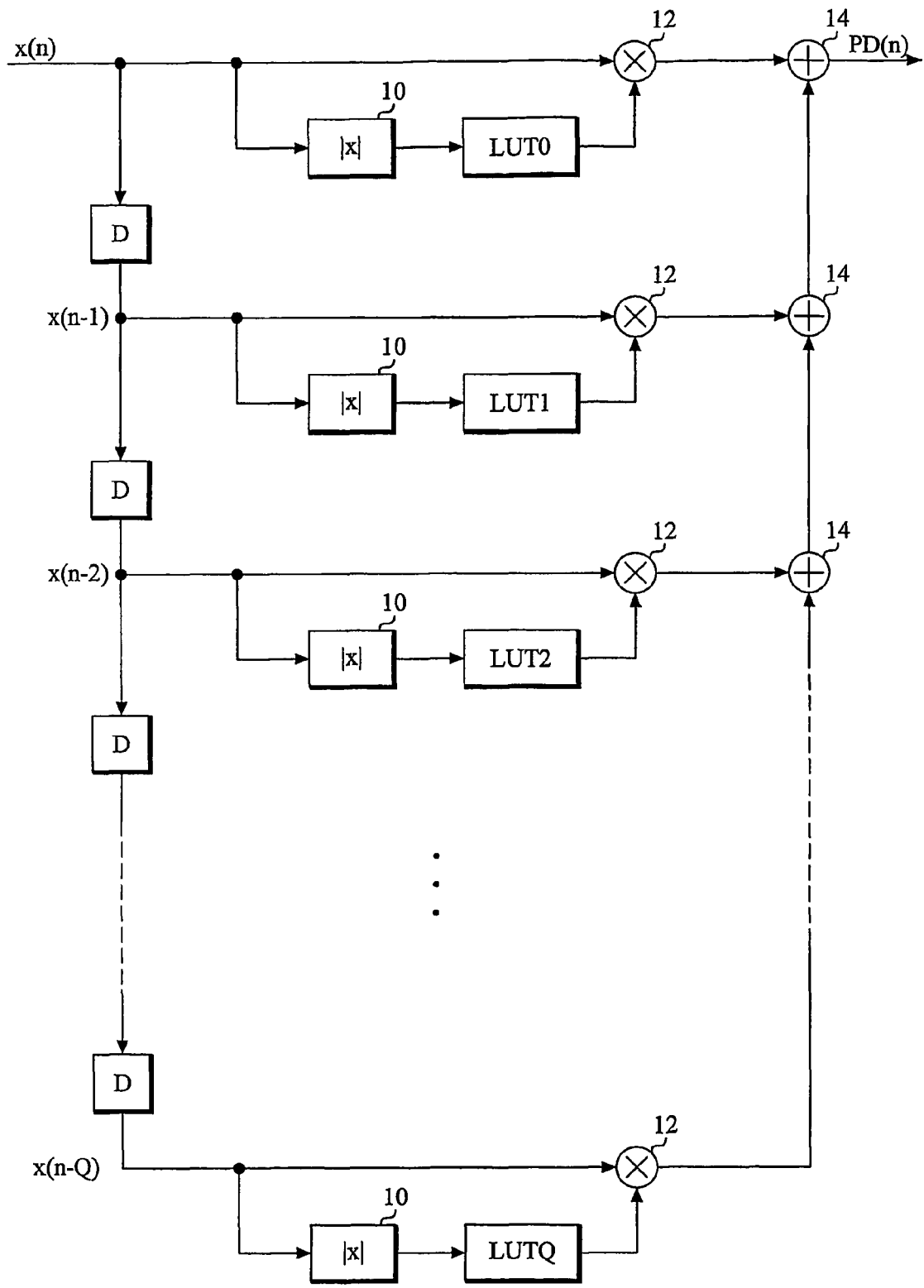
FIG. 7 is a block diagram of an exemplary embodiment of a pre-distorter.

In the non-limiting, example embodiment illustrated in FIG. 7, the complex input signal x(n) is forwarded to an absolute value block 10 and to a multiplier 12. The absolute value signal from block 10 is forwarded to a look-up table LUT0 representing a sampled version of polynomial $T_0$. The corresponding (generally complex) value from look-up table LUT0 is forwarded to multiplier 12, where it multiplies the input signal sample x(n). Input signal x(n) is also forwarded to a delay block D, where it is delayed one sample period for forming a delayed sample x(n−1). This delayed sample is processed in the same way as the non-delayed sample by an absolute value block 10, a multiplier 12 and a look-up table LUT1. However, look-up table LUT1 now represents a sampled version of polynomial $T_1$ instead of $T_0$. As illustrated in FIG. 7, further delays and look-up tables may be included (as indicated by the dots in the figure). Finally, the obtained products are added to each other in adders 14 to form the pre-distorted signal PD(n). The look-up tables make computation in real time much more efficient than the polynomial computation for each sample of the input signal used in [3]. The look-up tables may be updated to keep track of slow changes in the characteristics of the power amplifier.

As an example, a power amplifier with pronounced memory effects was measured and then pre-distorted with a single table pre-distorter (only the first branch with table LUT0 in FIG. 7). The simple single table pre-distorter could not resolve the non-symmetry in the measured signal spectrum at the output of the amplifier, although it improved distortion by 5-10 dB. The amplifier was then pre-distorted using a double table pre-distorter (the first two branches with tables LUT0 and LUT1 in FIG. 7). This simple extension to a double table pre-distorter had the effect of resolving the non-symmetry in the measured output signal. The improvement compared to a single table was in the order of 10 dB.

A further problem associated with power amplifiers is that rapidly (but slow in comparison to instantaneous signal variations) changing power levels on the input signal will give rise to changes in power amplifier parameters. Internal heating of semi-conductor components indirectly causes this. Therefore, a method is sought by which we can predict these changes in a fast manner, and thereafter apply these adjustments. In the discussion above, it has been assumed that the coefficients $a_{kq}$ in the polynomials:

$$T_q(|x(n-q)|) = \sum_{k=1}^{K} a_{kq} \cdot |x(n-q)|^{k-1} \quad (3)$$

are constants. However, a more flexible approach would be to let the coefficients depend on a slowly varying parameter "z"

representing, for example, average input power level, transistor temperature or transistor bias (voltage, current). In such a case, equation (3) is modified to:

$$T_q(|x(n-q)|, z) = \sum_{k=1}^{K} a_{kq}(z) \cdot |x(n-q)|^{k-1} \quad (4)$$

Expanding the coefficients $a_{kq}(z)$ in a McLaurin series and truncating this series after M terms, one obtains:

$$a_{kq}(z) = \sum_{m=0}^{M-1} b_{kq,m} z^m \quad (5)$$

where $b_{kq,m}$ are independent of z. Using this expansion, equation (4) may be written as:

$$T_q(|x(n-q)|, z) = \sum_{k=1}^{K} \sum_{m=0}^{M-1} b_{kq,m} z^m |x(n-q)|^{k-1} \quad (6)$$

This equation may be rearranged into partial sums containing the same power of z:

$$T_q(|x(n-q)|, z) = \sum_{k=1}^{K} \sum_{m=0}^{M-1} b_{kq,m} z^m |x(n-q)|^{k-1} =$$

$$\text{Separate } z \text{ powers} \begin{cases} = \underbrace{\sum_{k=1}^{K} b_{kq,0} |x(n-q)|^{k-1}}_{T_{q0}(|x(n-q)|)} + \\ + z \cdot \underbrace{\sum_{k=1}^{K} b_{kq,1} |x(n-q)|^{k-1}}_{T_{q1}(|x(n-q)|)} + \\ \vdots \\ + z^{M-1} \cdot \underbrace{\sum_{k=1}^{K} b_{kq,M-1} |x(n-q)|^{k-1}}_{T_{qM-1}(|x(n-q)|)} \end{cases} = \sum_{m=0}^{M-1} T_{qm}(|x(n-q)|) z^m$$

Thus, in this approximation the original polynomials $T_q(|x(n-q)|)$ may be expressed as a series of polynomials $T_{qm}(|x(n-q)|)$ multiplying different powers of z. The pre-distortion may in this approximation be written as;

$$PD(n, z) = \sum_{q=0}^{Q} x(n-q) \left[ \sum_{m=0}^{M-1} T_{qm}(|x(n-q)|) z^m \right] \quad (7)$$

Figure 8:
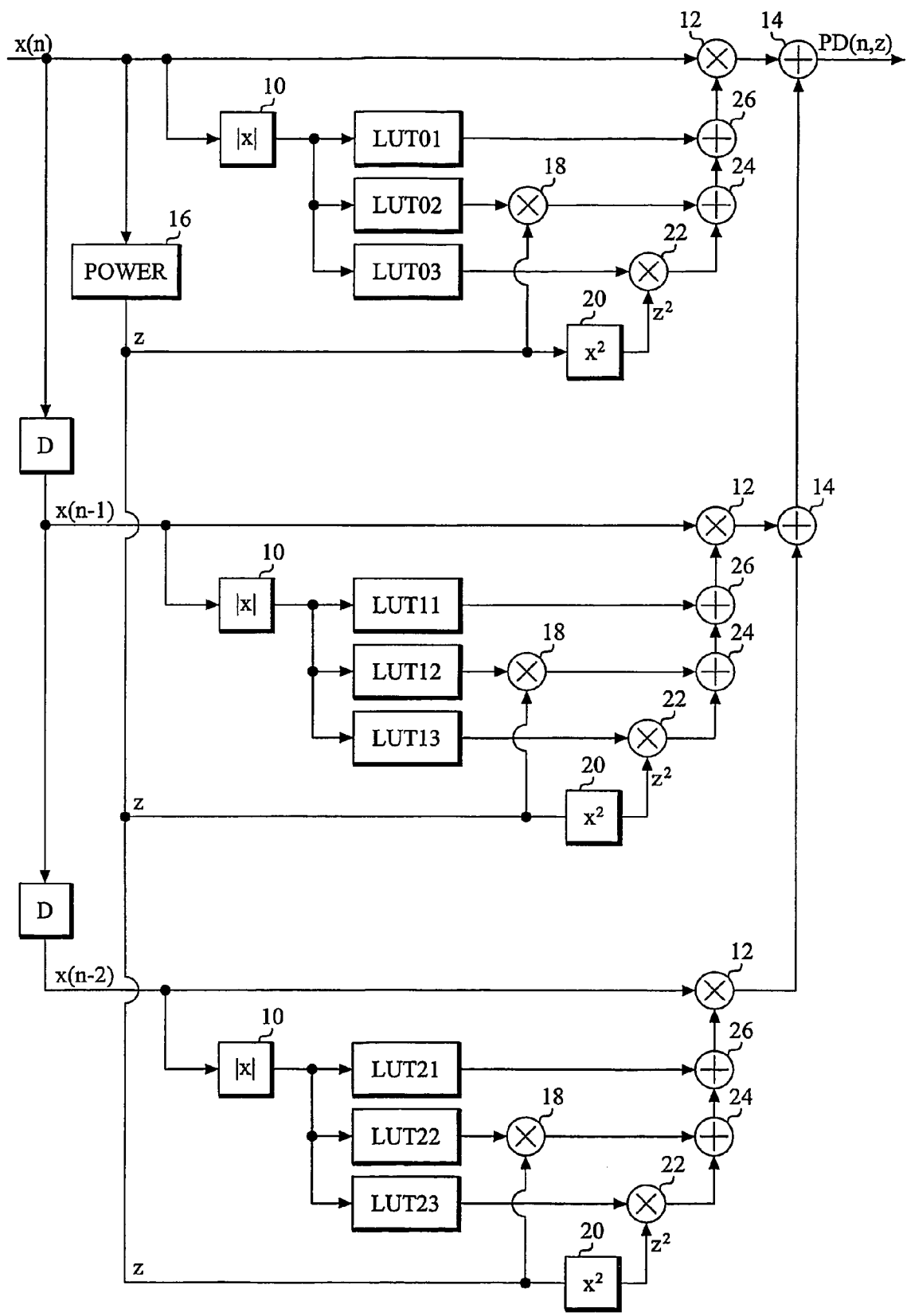
FIG. 8 is a block diagram of another exemplary embodiment of a pre-distorter.

In this approximation a pre-distorter may be implemented by a set of look-up tables in each delay branch, as illustrated in FIG. 8. The expressions in the brackets "[ ]" in equation (7) may be viewed as "filter coefficients".

In the non-limiting, example embodiment illustrated in FIG. 8 the delay depth is 2 (Q=2) and the McLaurin expansion includes 3 terms (M=3). Further terms and delays are possible, but these numbers have been chosen, since they are sufficiently large to illustrate the principles and sufficiently small to avoid cluttering of the figure. Each delay branch includes 3 look-up tables, for example LUT11, LUT12, LUT13, triggered by the same absolute signal value, |x(n−1)| in this case. This embodiment also includes a block 16 for calculating the average power z of the input signal. Block 16 may also include a smoothing filter (for example a FIR or IIR filter) to prevent abrupt changes in the power signal. The power value is forwarded to a multiplier 18 in each branch, where it is multiplied by the value from the corresponding look-up table LUT02, LUT12 or LUT22. The power value z is also forwarded to a squaring block 20 in each branch. A multiplier 22 multiplies the resulting squared power by the value from the corresponding look-up table LUT03, LUT13 or LUT23. These products are added in adders 24, and the sums are added to the values from look-up tables LUT01, LUT11 and LUT21 in adders 26. The resulting sums from adders 26 form the filter coefficients of the filter structure. From FIG. 8 and equation (7) it is noted that the embodiment of FIG. 7 and equation (2) may be considered as the special case z=0. A method for determining the look-up tables is described in the APPENDIX.

Figure 9:
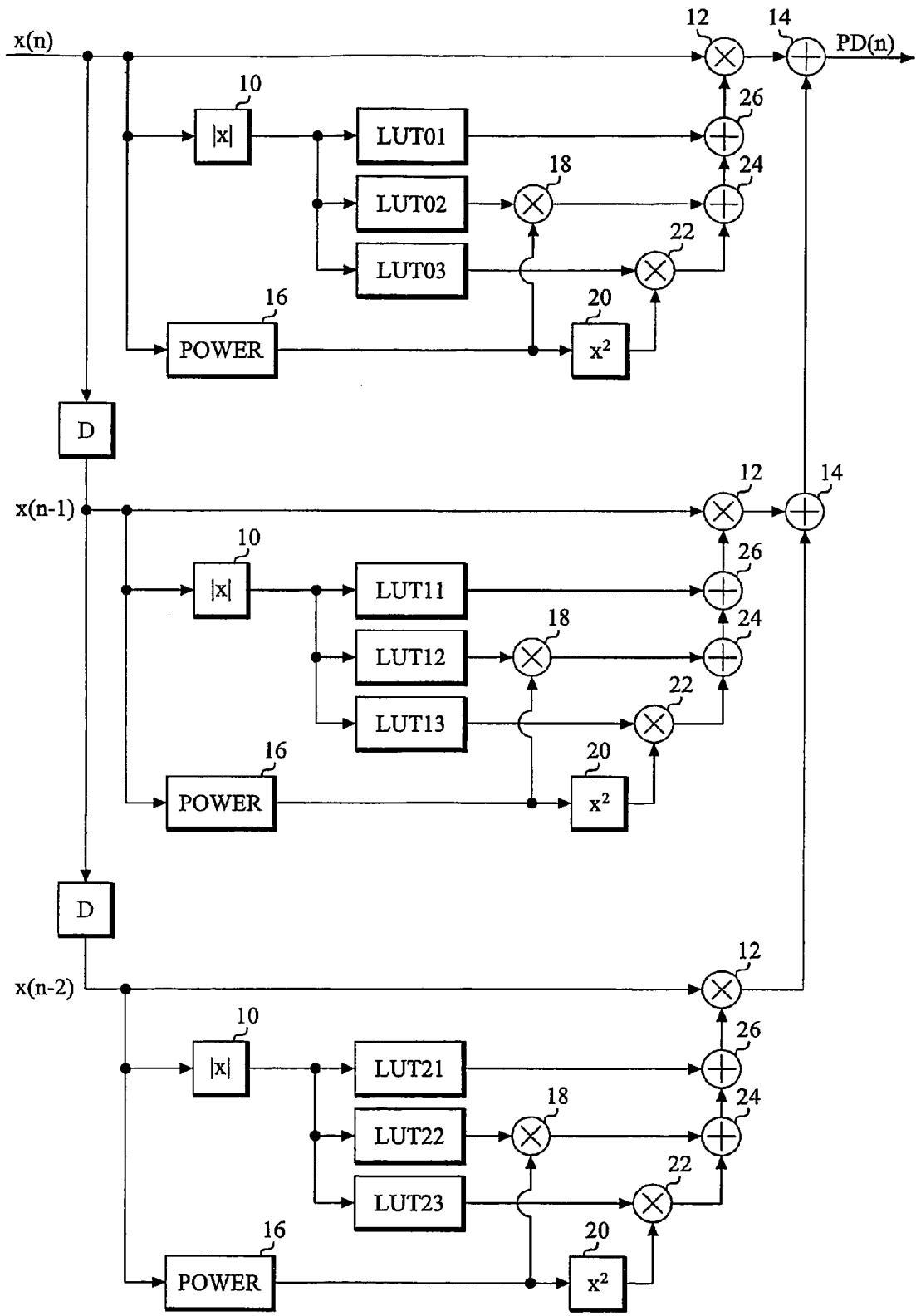
FIG. 9 is a block diagram of another exemplary embodiment of a pre-distorter.

Since the parameter z is slowly varying, the average power calculated in the common block 16 in the embodiment of FIG. 8 may instead be calculated in each delay branch. Such an embodiment is illustrated in FIG. 9. Although the outputs from blocks 16 may not be identical, they are approximately the same due to the slowly varying average power.

Figure 10:
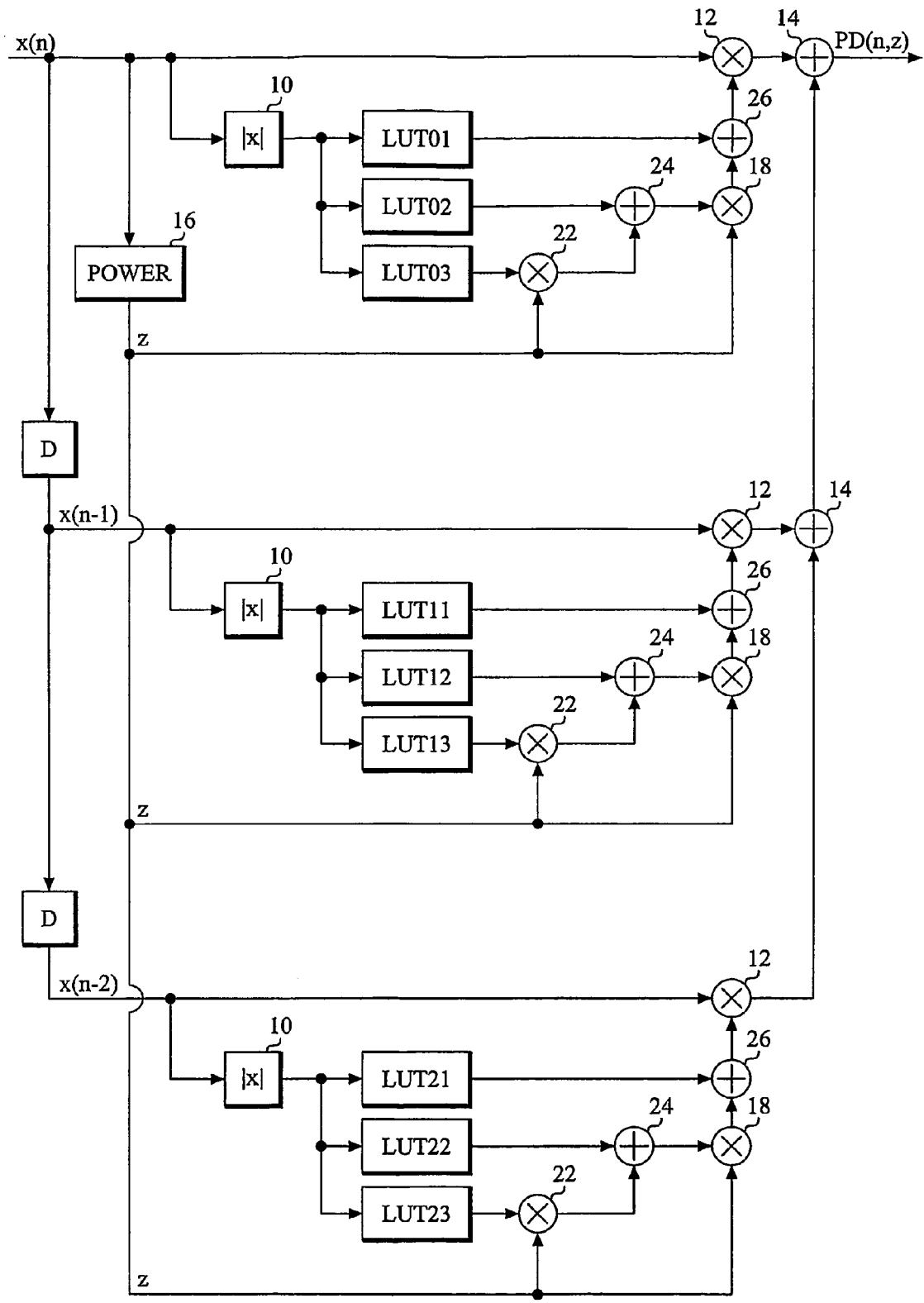
FIG. 10 is a block diagram of another exemplary embodiment of a pre-distorter.

Another variation of the embodiment in FIG. 8 is illustrated in FIG. 10. This embodiment eliminates the squaring block 20 by rearranging the order of blocks 18, 22 and 24. It is based on the algebraic identity:

$$a + bz + cz^2 = a + (b + cz)z$$

Figure 11:
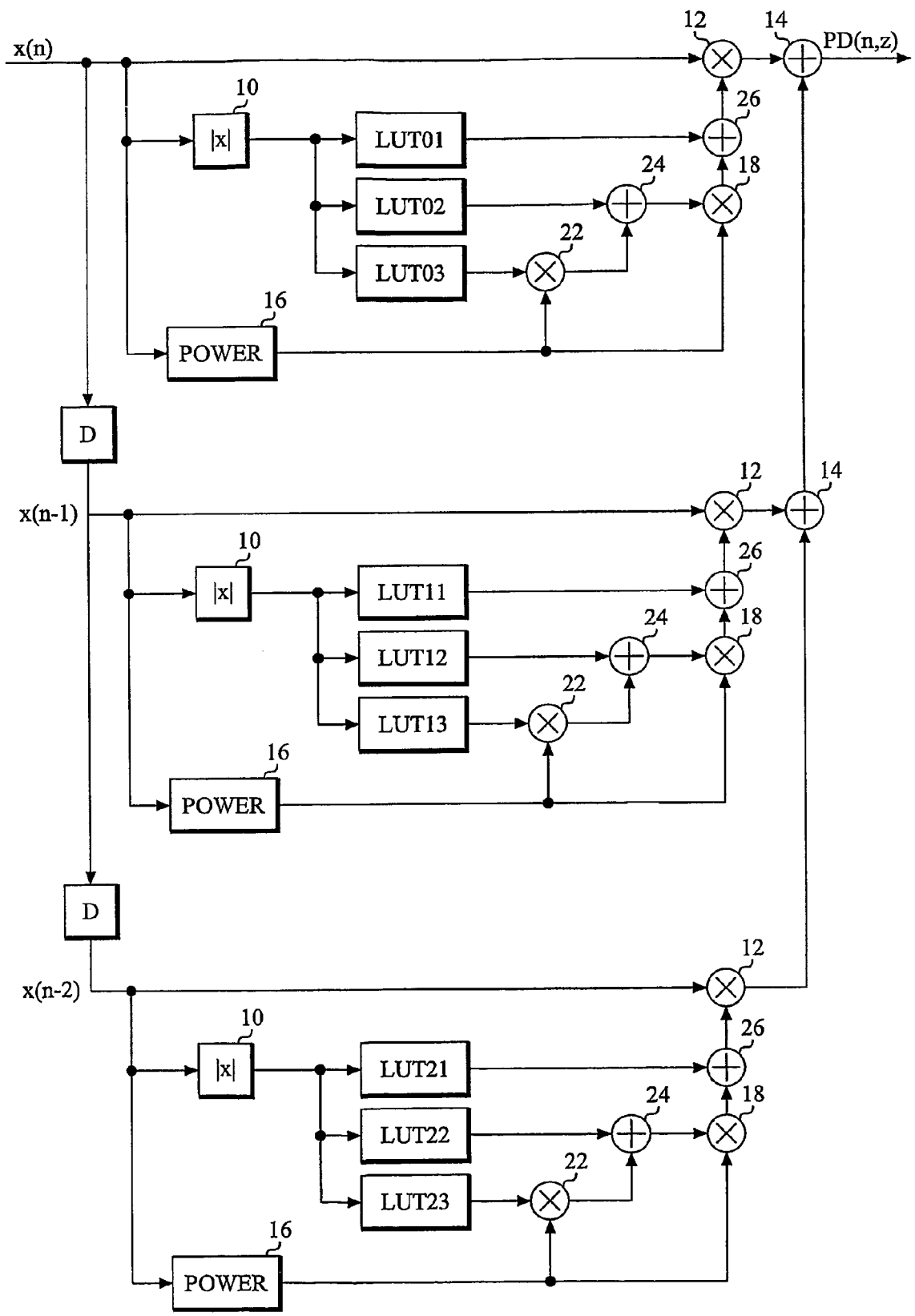
FIG. 11 is a block diagram of another exemplary embodiment of a pre-distorter.

A similar variation of the embodiment of FIG. 9 is illustrated in FIG. 11. It is appreciated that further equivalent embodiments may be obtained by other rearrangements of the algebraic expressions in equation (7). For example, instead of performing the multiplications by z and $z^2$ before the multiplications by the signal and delayed signals, the multiplication order may be reversed.

Figure 12:
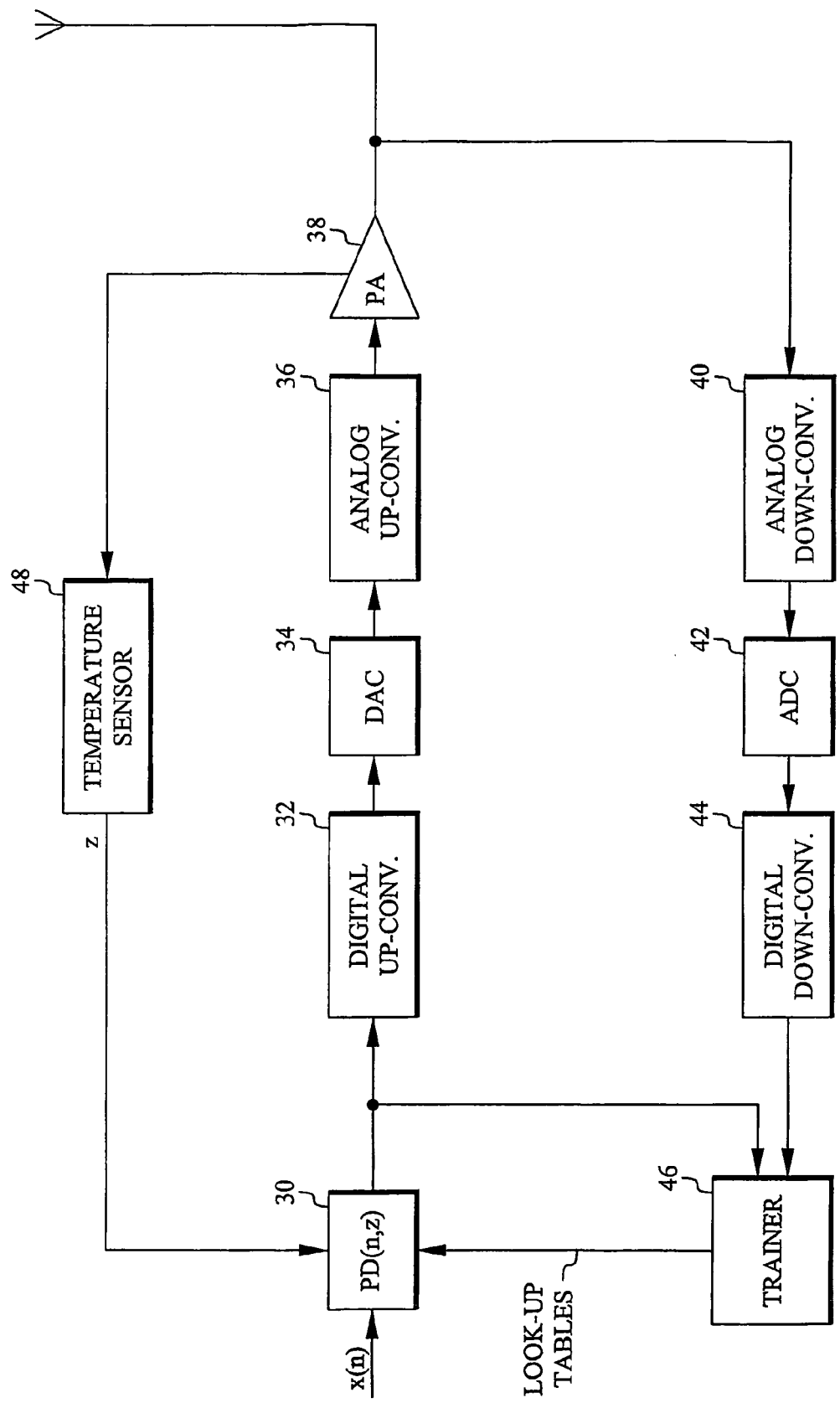
FIG. 12 is a block diagram of an exemplary embodiment of a base station including a power amplifier provided with a pre-distorter.

FIG. 12 is a block diagram of a non-limiting, example embodiment of a base station including a power amplifier provided with a pre-distorter. In FIG. 12 elements that are not necessary for understanding have been omitted. The baseband complex signal x(n) is forwarded to a pre-distorter 30 in accordance with the present invention. The pre-distorted signal is up-converted to intermediate frequency (IF) in a digital up-converter 32 and converted into an analog signal in a D/A converter 34, which in turn is up-converted to radio frequency (RF) by an analog up-converter 36. The RF signal is forwarded to a power amplifier 38, and the amplified signal is forwarded to an antenna. The amplified RF signal is also forwarded to a feedback down-conversion chain including an analog down-converter 40, an A/D converter 42 and a digital down-converter 44. The down-converted feedback signal is forwarded to a trainer 46, which also receives the pre-distorted input signal for determining the look-up tables in pre-distorter 30 in accordance with the mathematical principles described above. In this embodiment pre-distorter 30 may, for example, be implemented as in FIG. 8 or 10, but provided with a temperature sensor 48 sensing the power amplifier temperature instead of a power calculation block 16.

The pre-distorter in accordance with the present invention may be implemented as an FPGA (Field Programmable Gate Array). Another possibility is to use a micro processor or a micro/signal processor combination and corresponding software. The actual computation of the look-up table entries may be done in an off-line manner at a slow update speed.

If it is desirable to keep the look-up tables small, the resolution of $|x(n)|$ may be coarser that the resolution of $x(n)$.

In the description above, it has been assumed that the input signal amplitude is used as an index into the look-up tables. However, other variables that depend on the input signal amplitude, such as the instantaneous input signal power, may also be used.

Although described with reference to a FIR filter structure, it is also possible to use the same principles for an IIR (Infinite Impulse Response) filter structure, or a combination of FIR and IIR filter structures. Thus the most general filter structure in which the technology may be implemented is a discrete time filter structure.

It will be understood by those skilled in the art that various modifications and changes may be made without departure from the scope of the invention, which is defined by the appended claims.

APPENDIX

A method to compute the tables LUT00, LUT01, . . . is to use already stored tables for certain values of the parameter "z". In this APPENDIX "z" is assumed to represent power level. However, the method is valid also for other parameters, such as power amplifier (transistor) temperature.

If we first reduce equation (7) to a memory-less system, this method can easily be explained. With the knowledge obtained from the memory-less system, the method can be extended to include also systems with memory. Thus, for a memory-less system we have:

$$PD(n,z) = x(n) \cdot [T_0(|x(n)|) + z \cdot T_1(|x(n)|) + z^2 \cdot T_2(|x(n)|)] \quad (A1)$$

The pre-distorter as expressed in equation (A1) above, is approximately valid over a certain range of power levels z. Now, if we compute the tables for 3 power levels, then it should be possible to extract three new tables $T_n$. So, let us write down the three equations that will lead us to solve for $T_n$. Assume first that the table $T_0$ is dedicated to 0 dBm power, then the equations will become:

$$PD(n,0) = x(n) \cdot [T_0(|x(n)|)]$$

$$PD(n,z_1) = x(n) \cdot [T_0(|x(n)|) + z_1 \cdot T_1(|x(n)|) + z_1^2 \cdot T_2(|x(n)|)]$$

$$PD(n,z_2) = x(n) \cdot [T_0(|x(n)|) + z_2 \cdot T_1(|x(n)|) + z_2^2 \cdot T_2(x(n)|)] \quad (A2)$$

Remember that the pre-distorters on the left-hand side of equation (A2) are known. By simplifying the formulation, these equations can be written in a slightly different way. Denoting the tables $[Q_0\ Q_1\ Q_2]$ at specific power levels $[0, z_1$ and $z_2]$ will give the following equations:

$$x(n) \cdot Q_0(|x(n)|) = x(n) \cdot [T_0(|x(n)|)]$$

$$x(n) \cdot Q_1(|x(n)|) = x(n) \cdot [T_0(|x(n)|) + z_1 \cdot T_1(|x(n)|) + z_1^2 \cdot T_2(|x(n)|)]$$

$$x(n) \cdot Q_2(|x(n)|) = x(n) \cdot [T_0(|x(n)|) + z_2 \cdot T_1(|x(n)|) + z_2^2 \cdot T_2(|x(n)|)] \quad (A3)$$

The solution to equation (A3) is now readily at our hand as:

$$\begin{bmatrix} T_0(|x(n)|) \\ T_1(|x(n)|) \\ T_2(|x(n)|) \end{bmatrix} = \begin{bmatrix} 1 & 0 & 0 \\ 1 & z_1 & z_1^2 \\ 1 & z_2 & z_2^2 \end{bmatrix}^{-1} \cdot \begin{bmatrix} Q_0(|x(n)|) \\ Q_1(|x(n)|) \\ Q_2(|x(n)|) \end{bmatrix} \quad (A4)$$

So concluding this part, we see that the interpolating polynomial in equation (A1) can directly be used to compute corrections to the basic tables computed at for example z=0 dBm power. The tables $T_n$ are derived from equation (A4), which in turn makes use of stored tables $Q_n$. A new table for any other signal power can be computed by simply setting z= power level, and summing up the tables with these weights.

Solving the inverse matrix in equation (A4) will give the following result:

$$\begin{bmatrix} T_0(|x(n)|) \\ T_1(|x(n)|) \\ T_2(|x(n)|) \end{bmatrix} = \begin{bmatrix} 1 & 0 & 0 \\ c_{21} & c_{22} & c_{23} \\ c_{31} & c_{32} & c_{33} \end{bmatrix} \cdot \begin{bmatrix} Q_0(|x(n)|) \\ Q_1(|x(n)|) \\ Q_2(|x(n)|) \end{bmatrix} \quad (A5)$$

So, the pre-distorter in equation (A1) can also, using the inverse matrix elements "c" of equation (A5), explicitly be written as:

$$PD(n,z) = x(n) \cdot \begin{bmatrix} Q_0(|x(n)|) + \\ +(c_{12} + c_{22} \cdot z + c_{32} \cdot z^2) \cdot Q_1(|x(n)|) + \\ +(c_{13} + c_{23} \cdot z + c_{33} \cdot z^2) \cdot Q_2(|x(n)|) \end{bmatrix} \quad (A6)$$

As a further refinement to the solution, exactly the same strategy can be used for the polynomials (or tables) for the memory system. The two systems can be treated separately without any coupling among them.

As an example, a power amplifier is measured for input and output signals at 3 different power levels: 0 dB, −3 dB and −9 dB. For each power level, tables $Q_{0-2}$ that work as pre-distorters at their respective power levels are computed. The objective is to compute the parameters "c", and then to use equation (A6) to compute a new table for power level z=−6 dB, for example.

To compute the "c"-parameters, set $z_1=-3$ dB, $z_2=-9$ dB in the calibration step, then the "c"-parameters will become:

$$\begin{bmatrix} 1 & 0 & 0 \\ c_{21} & c_{22} & c_{23} \\ c_{31} & c_{32} & c_{33} \end{bmatrix} = \begin{bmatrix} 1 & 0 & 0 \\ 1 & (-3) & (-3)^2 \\ 1 & (-9) & (-9)^2 \end{bmatrix}^{-1} = \begin{bmatrix} 1 & 0 & 0 \\ 0.444 & -0.5 & 0.056 \\ 0.037 & -0.056 & 0.019 \end{bmatrix} \quad (A7)$$

The result of using this interpolated pre-distorter compared to use a directly computed pre-distorter works very well, with only a minor difference in spectrum level close to the carrier.

It is also possible to calculate $T_0$, $T_1$ and $T_2$ in equation (A3) by expanding them into polynomials in $|x(n)|$ and solving for the coefficients using the Least Mean Squares (LMS) method. This gives the further advantage of an "automatic" extrapolation of the initial tables. Thus, if tables are available for low power levels, corresponding tables for higher power levels can be obtained by extrapolation according to this method.

REFERENCES

[1] EP 0 813 300 A1, Loral Aerospace Corporation, "Signal conditioner with symbol addressed lookup table based transversal filters".

[2] U.S. Pat. No. 5,923,712, R. R. Leyendecker et al, "Method and apparatus for linear transmission by direct inverse modeling".

[3] Lei Ding, G. Tong Zhou, Zhengxiang Ma, Dennis R. Morgan, J. Stevenson Kenney, Jaehyeong Kim, Charles R. Giardina, (School of electrical and computer engineering, Georgia Institute of Technology, Atlanta), "A robust digital baseband predistorter constructed using memory polynomials", Manuscript submitted to IEEE Trans. on Communication, Mar. 16, 2002.

[4] J. Kim and K. Konstantinou, "Digital predistortion of wideband signals based on power amplifier model with memory", IEE Electronics Letters, 8:th Nov. 2001, Vol. 37. No. 23.

The invention claimed is:

1. A power amplifier pre-distorter formed by a discrete-time filter structure with filter taps, wherein said filter structure includes:
an individual look-up table for each filter tap, each look-up table representing a sampled polynomial in a variable representing signal amplitude;
means for selecting, from each filter tap look-up table a filter coefficient that depends on the amplitude of a corresponding complex signal value to be multiplied by the filter tap; and
means for compensating for changes in at least one predetermined parameter,
wherein said parameter represents amplifier temperature and said compensating for changes in amplifier temperature is not dependent on memory effects of the amplifier, and
wherein pre-distortion (PD(n,z)) for the power amplifier stored in the individual look-up tables is approximated as:

$$PD(n, z) = \sum_{q=0}^{Q} x(n-q)\left[\sum_{m=0}^{M-1} T_{qm}(|x(n-q)|)z^m\right]$$

where z is the predetermined parameter, q represents time, x(n) is an input signal sample, $T_{qm}(|x(n-q)|)$ is a series of polynomials in the absolute value of the complex variable x(n−q), and M is a number of polynomial terms in the series.

2. The pre-distorter of claim 1, wherein the discrete-time filter structure comprises a FIR filter structure.

3. The pre-distorter of claim 1, wherein the discrete-time filter structure comprises an IIR filter structure.

4. The pre-distorter of claim 1, wherein the discrete-time filter structure comprises a combination of a FIR filter structure and an IIR filter structure.

5. The pre-distorter of claim 1, wherein said parameter also represents average pre-distorter input signal power.

6. The pre-distorter of claim 1, wherein said parameter also represents power amplifier transistor bias.

7. The pre-distorter of claim 1, wherein the means for selecting is arranged to select, from each filter tap look-up table, a filter coefficient that depends also on an instantaneous signal power of a corresponding complex signal value to be multiplied by the filter tap.

8. A base station including a power amplifier pre-distorter formed by a discrete-time filter structure with filter taps, wherein said filter structure includes
an individual look-up table for each filter tap, each look-up table representing a sampled polynomial in a variable representing signal amplitude;
selection circuitry arranged to select, from each filter tap look-up table, a filter coefficient that depends on the amplitude of a corresponding complex signal value to be multiplied by the filter tap; and
compensation circuitry arranged to compensate for changes in at least one predetermined parameter,
wherein said parameter represents amplifier temperature and said compensation for changes in amplifier temperature is not dependent on memory effects of the amplifier,
wherein pre-distortion (PD(n,z)) for the power amplifier stored in the individual look-up tables is approximated as:

$$PD(n, z) = \sum_{q=0}^{Q} x(n-q)\left[\sum_{m=0}^{M-1} T_{qm}(|x(n-q)|)z^m\right]$$

where z is the predetermined parameter, q represents time, x(n) is an input signal sample, $T_{qm}(|x(n-q)|)$ is a series of polynomials in the absolute value of the complex variable x(n−q), and M is a number of polynomial terms in the series.

9. The base station of claim 8, wherein the discrete-time filter structure comprises a FIR filter structure.

10. The base station of claim 8, wherein the discrete-time filter structure comprises an IIR filter structure.

11. The base station of claim 8, wherein the discrete-time filter structure comprises a combination of a FIR filter structure and an IIR filter structure.

12. The base station of claim 8, wherein said parameter also represents average pre-distorter input signal power.

13. The base station of claim 8, wherein said parameter also represents power amplifier transistor bias.

14. The base station of claim 8, wherein the selection circuitry is arranged to select, from each filter tap look-up table, a filter coefficient that depends also on an instantaneous signal power of a corresponding complex signal value to be multiplied by the filter tap.

15. A method for pre-distorting a signal to be input to a power amplifier using a pre-distorter formed by a discrete-time filter structure with filter taps, comprising:
providing a look-up table for each filter tap that represents a sampled polynomial in a variable representing signal amplitude;
selecting from each filter tap look-up table a filter coefficient that depends on the amplitude of a corresponding complex signal value to be multiplied by the filter tap;
compensating for changes in at least one predetermined parameter,
wherein said parameter represents amplifier temperature and said compensating for changes in amplifier temperature is not dependent on memory effects of the amplifier, and
wherein pre-distortion (PD(n,z)) for the power amplifier stored in the individual look-up tables is approximated as:

$$PD(n, z) = \sum_{q=0}^{Q} x(n-q) \left[ \sum_{m=0}^{M-1} T_{qm}(|x(n-q)|) z^m \right]$$

where z is the predetermined parameter, q represents time, x(n) is an input signal sample, $T_{qm}(|x(n-q)|)$ is a series of polynomials in the absolute value of the complex variable x(n−q), and M is a number of polynomial terms in the series.

16. The method of claim 15, wherein said parameter also represents average pre-distorter input signal power.

17. The method of claim 15, wherein said parameter also represents power amplifier transistor bias.

18. The method of claim 15, wherein a filter coefficient from each filter tap look-up table is selected that depends also on an instantaneous signal power of a corresponding complex signal value to be multiplied by the filter tap.

* * * * *

UNITED STATES PATENT AND TRADEMARK OFFICE
CERTIFICATE OF CORRECTION

PATENT NO. : 7,746,955 B2
APPLICATION NO. : 10/549569
DATED : June 29, 2010
INVENTOR(S) : Rexberg It is certified that error appears in the above-identified patent and that said Letters Patent is hereby corrected as shown below:

Title Page 2, in Field (56), under "OTHER PUBLICATIONS", in Column 1, Lines 1-3, delete "Kim et al., Digital predistortion of wideband signals based on power amplifier model with memory, Electronics Letters, Nov. 8, 2001, vol. 37, No. 23, pp. 1417-1418.".

Title Page 2, in Field (56), under "OTHER PUBLICATIONS", in Column 1, Lines 4-6, delete "Lei Ding et al., A Robust Digital Baseband Predistorter Constructed Using Memory Polynomials. Manuscript submitted to IEEE Trans. on Communication, Mar. 16, 2002, pp. 1-23.".

In Column 1, Line 52, delete "et." and insert -- et --, therefor.

In Column 2, Line 31, after "pre-distorter;" insert -- and --.

In Column 3, Line 19, delete "akq" and insert -- αkq --, therefor.

In Column 4, Line 1, delete "akq" and insert -- αkq --, therefor.

In Column 4, Line 58, delete "akq" and insert -- αkq --, therefor.

In Column 5, Line 11, delete "akq(z)" and insert -- αkq(z) --, therefor.

In Column 7, Line 54, in Equation "(A2)", delete "T2(x(n)|) [" and insert -- T2(|x(n)|)] --, therefor.

Signed and Sealed this
Fourth Day of October, 2011

David J. Kappos
*Director of the United States Patent and Trademark Office*